United States Patent
Tsuchitani et al.

[11] Patent Number: 6,084,263
[45] Date of Patent: Jul. 4, 2000

[54] POWER DEVICE HAVING HIGH BREAKDOWN VOLTAGE AND METHOD OF MANUFACTURING THE SAME

[75] Inventors: Masanobu Tsuchitani; Shizue Hori; Akihiko Osawa, all of Tokyo, Japan

[73] Assignee: Kabushiki Kaisha Toshiba, Kawasaki, Japan

[21] Appl. No.: 09/027,727

[22] Filed: Feb. 23, 1998

[30] Foreign Application Priority Data

Feb. 24, 1997 [JP] Japan ................................. 9-039040

[51] Int. Cl.[7] ........................... H01L 29/76; H01L 29/94; H01L 31/062; H01L 31/113; H01L 31/119
[52] U.S. Cl. ..................... 257/328; 257/329; 257/566; 257/567; 257/652
[58] Field of Search .................................. 257/328, 329, 257/566, 567, 652

[56] References Cited

U.S. PATENT DOCUMENTS 4,400,716  8/1983  Tani et al. .............................. 257/652
5,410,177  4/1995  Harmel et al. .......................... 257/567

*Primary Examiner*—Steven H. Loke
*Assistant Examiner*—Thien F Tran
*Attorney, Agent, or Firm*—Finnegan, Henderson, Farabow, Garrett & Dunner, L.L.P.

[57] ABSTRACT

The main characteristic feature of the invention is to prevent a leakage current from flowing when a planar type semiconductor device having a high breakdown voltage is reverse-biased. For example, a semiconductive film is formed on the surface of an n-type Si substrate between a second p-type base layer selectively formed on the surface of the Si substrate and a channel stop layer formed to surround the second p-type base layer at a predetermined interval. The dangling bond density of the semiconductive film is set at $1.25 \times 10^{18}$ cm$^{-3}$. With this structure, the discrete level in the band gap approach a continuum, and the time required to populate the trapping level in the semiconductive film with carriers is shortened.

7 Claims, 4 Drawing Sheets

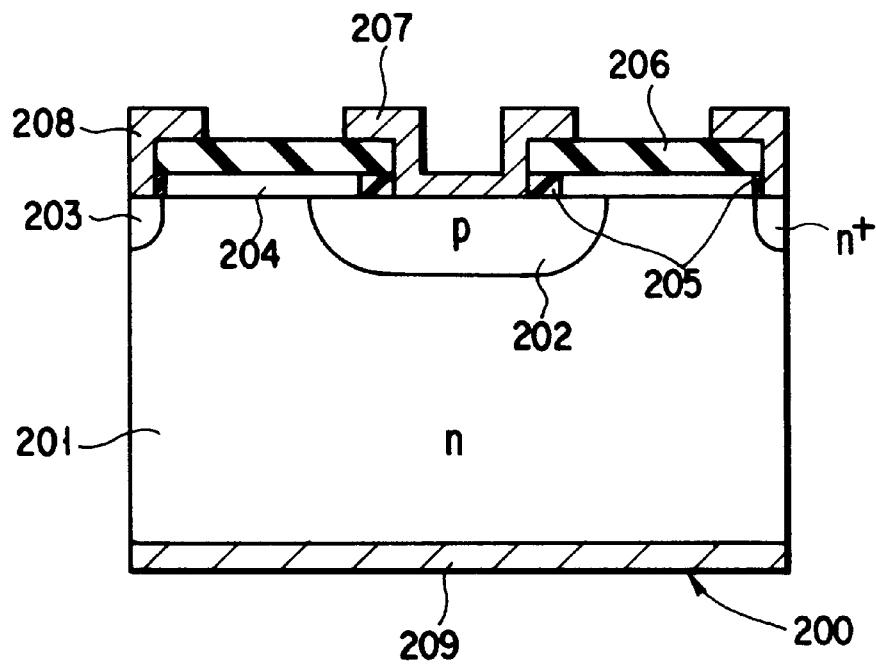
F I G. 5
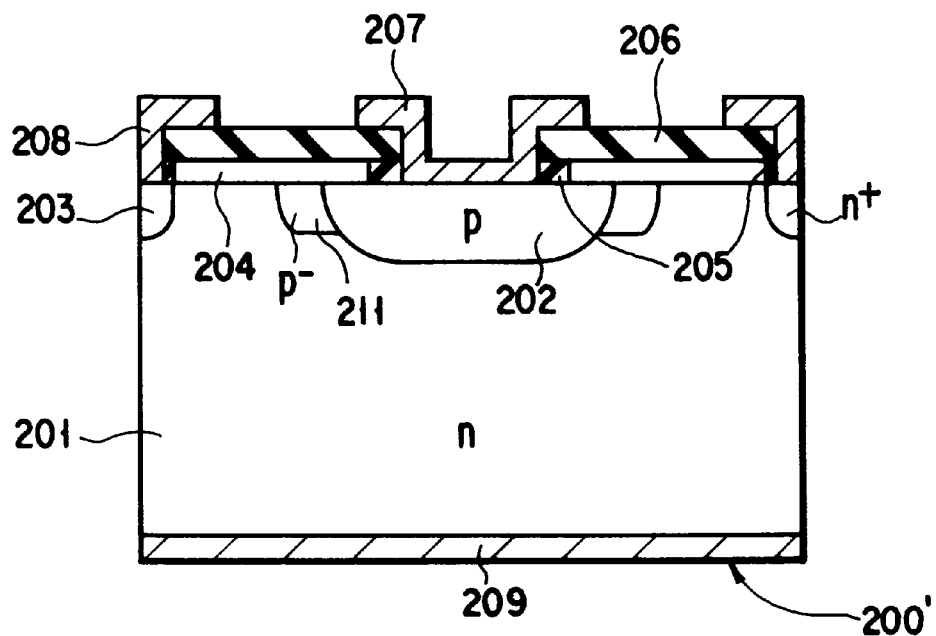
F I G. 6

POWER DEVICE HAVING HIGH BREAKDOWN VOLTAGE AND METHOD OF MANUFACTURING THE SAME

BACKGROUND OF THE INVENTION

The present invention relates to a semiconductor device and a method of manufacturing the same and, more particularly, to a planar type semiconductor device having a high breakdown voltage.

As is known, in a p-n junction diode as one of planar type semiconductor devices, a semiconductive film having a dangling bond density of about $5 \times 10^{17}$ cm$^{-3}$ is formed on the surface of an n-type semiconductor substrate between a p-type diffusion layer (anode) selectively formed on the substrate surface and an n$^+$-type diffusion layer (channel stopper) formed to surround the anode at an interval, thereby improving the breakdown voltage of the device.

With this structure, when the trapping level in the semiconductive film is populated with carriers, the interface between the semiconductive film and the semiconductor substrate stabilizes to smoothly spread the depletion layer.

In the above structure, however, the interface between the semiconductive film and the semiconductor substrate is unstable until the trapping level in the semiconductive film is populated with carriers. For this reason, when the device is suddenly reverse-biased (dV/dt:large), a leakage current (TVLC:Transient Voltage Leaking Current) undesirably flows.

The speed at which the trapping level is populated with carriers depends on hopping conduction which takes place via a few discrete levels in the band gap of the semiconductive film. Therefore, as the discrete levels in the band gap approach a continuum the speed increases.

However, in the conventional semiconductive film using helium-based silane, a time of roughly 250 $\mu$s is required to populate the trapping level with carriers. Therefore, the TVLC flows until 250 $\mu$s elapse after application of the reverse-bias voltage (FIG. 1).

BRIEF SUMMARY OF THE INVENTION

As described above, conventionally, a semiconductive film having a dangling bond density of about $5 \times 10^{17}$ cm$^{-3}$ is formed between the anode and the channel stopper to improve the breakdown voltage of the device. However, when the device is abruptly reverse-biased, a TVLC flows.

It is an object of the present invention to provide a semiconductor device having a high breakdown voltage and capable of preventing a leakage current from flowing when the device is reverse-biased, and a method of manufacturing the same.

In order to achieve the above object, according to the present invention, there is provided a semiconductor device comprising a semiconductor substrate of a first conductivity type, a first diffusion layer of a second conductivity type, which is selectively formed on one major surface of the semiconductor substrate, a second diffusion layer of the first conductivity type, which is formed on the one major surface of the semiconductor substrate at a predetermined interval from the first diffusion layer, and a semiconductive film formed on the one major surface of the semiconductor substrate between the second and first diffusion layers and having a dangling bond density of not less than $10^{18}$ cm$^{-3}$.

According to the present invention, there is also provided a method of manufacturing a semiconductor device, comprising the steps of selectively forming a first diffusion layer of a second conductivity type on one major surface of a semiconductor substrate of a first conductivity type, forming a second diffusion layer of the first conductivity type on the one major surface of the semiconductor substrate at a predetermined interval from the first diffusion layer, and forming a semiconductive film on the one major surface of the semiconductor substrate between the second and first diffusion layers while setting a dangling bond density at not less than $10^{18}$ cm$^{-3}$.

According to the present invention, there is also provided a method of manufacturing a semiconductor device, comprising the steps of selectively forming a first diffusion layer of a second conductivity type on one major surface of a semiconductor substrate of a first conductivity type, forming a second diffusion layer of the first conductivity type on the one major surface of the semiconductor substrate at a predetermined interval from the first diffusion layer, forming a thermal oxide film on an entire surface by thermal oxidation, selectively removing the thermal oxide film between the first and second diffusion layers, forming a semiconductive film having a dangling bond density of not less than $10^{18}$ cm$^{-3}$ on the one major surface of the semiconductor substrate between the first and second diffusion layers from which the thermal oxide film is removed, forming an oxide film on the entire surface by atmospheric pressure CVD, selectively removing the thermal oxide film and the oxide film on the first and second diffusion layers, and forming a first electrode connected to the first diffusion layer and a second electrode connected to the second diffusion layer.

According to the semiconductor device of the present invention and the method of manufacturing the same, the discrete levels in the band gap of the semiconductive film approach a continuum. With this structure, the time required until the trapping level in the semiconductive film is populated with carriers can be shortened.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a graph showing the dependence of current on voltage as a function of time so as to explain a prior art and a problem thereof;

FIG. 5 is a schematic sectional view showing the structure of a p-n junction diode according to the second embodiment of the present invention; and FIG. 6 is a schematic sectional view showing the structure of a p-n junction diode according to the third embodiment of the present invention.

DETAILED DESCRIPTION OF THE INVENTION

The embodiments of the present invention will be described below with reference to the accompanying drawings.

Figure 4:
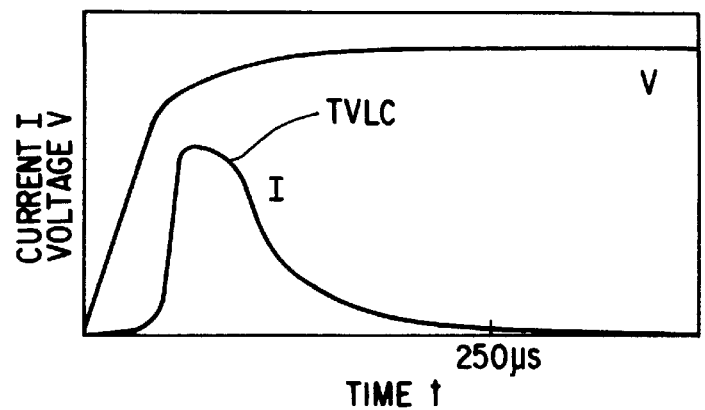
FIGS. 4A and 4B are graphs showing the observation result of a TVLC in the first embodiment of the present invention in comparison with that of the prior art.
Figure 2A:
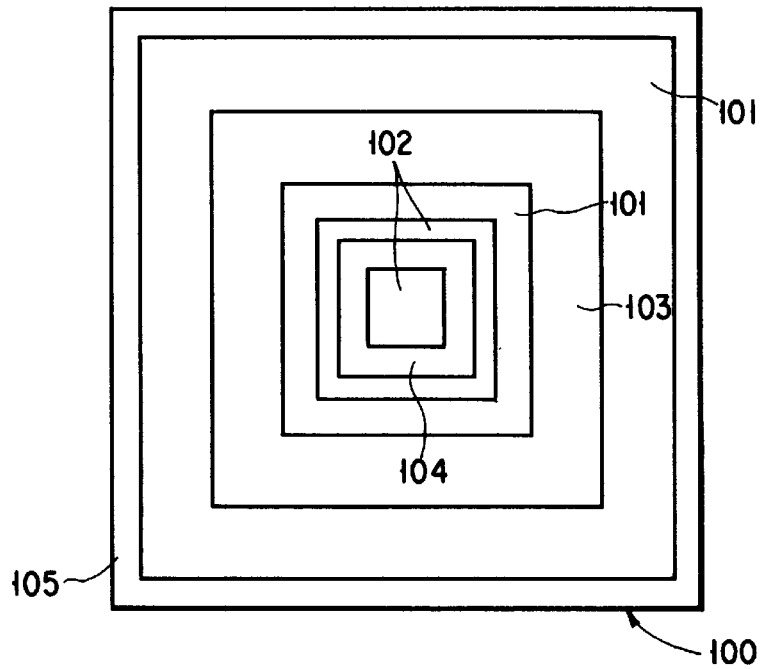
FIGS. 2A and 2B are plan and sectional views, respectively, showing the structure of an IGBT according to the first embodiment of the present invention.
Figure 2B:
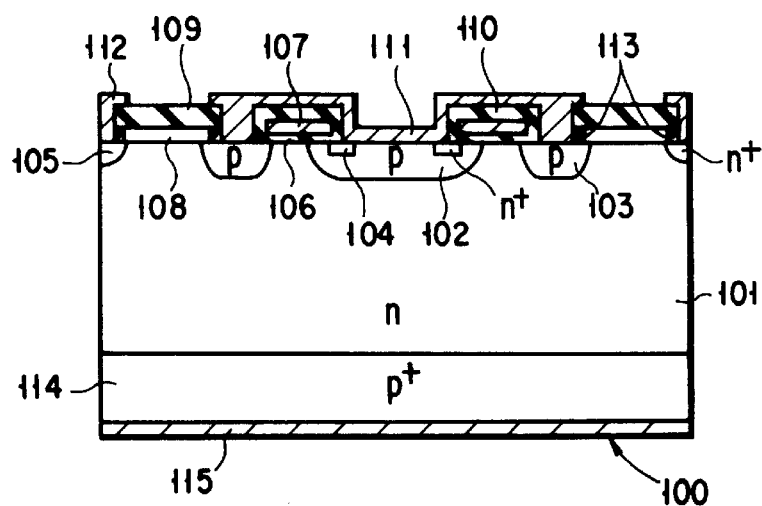

FIGS. 2A and 2B show the schematic structure of an IGBT (Insulated Gate Bipolar Transistor) as a planar type semiconductor device according to the first embodiment of the present invention. FIG. 2A is a plan view of the IGBT, and FIG. 2B is a sectional view of the IGBT.

In an IGBT 100, a first p-type base layer 102 is selectively formed on the surface (one major surface) of an n-type Si substrate (semiconductor substrate of the first conductivity type) 101, and a second p-type base layer (first diffusion layer of the second conductivity type) 103 is formed to surround the first p-type base layer 102 at an interval.

The Si substrate 101 has a resistivity p of about 170 Ω·cm and a thickness of about 625 μm.

The first and second p-type base layers 102 and 103 are simultaneously formed by, e.g., ion-implanting B at an acceleration voltage of 60 kev and a dose of $8 \times 10^{13}$ cm$^{-2}$ and performing thermal diffusion in a nitrogen atmosphere at 1,150° C. for 60 minutes.

An n$^+$-type emitter layer 104 is selectively formed in the first p-type base layer 102.

An n$^+$-type channel stop layer 105 (second diffusion layer of the first conductivity type) is formed on the surface of the Si substrate 101 to surround the second p-type base layer 103 at a predetermined interval.

The emitter layer 104 and the channel stop layer 105 are simultaneously formed by, e.g., ion-implanting As at an acceleration voltage of 40 keV and a dose of $5 \times 10^{15}$ cm$^{-2}$ and performing thermal diffusion in an oxygen atmosphere at 1,000° C. for 20 minutes.

A gate electrode 107 is formed on the surface of the Si substrate 101 between the first and second p-type base layers 102 and 103 via a gate oxide film 106.

A semiconductive film 108 having a dangling bond density around $1.25 \times 10^{18}$ cm$^{-3}$ is formed on the surface of the Si substrate 101 between the second p-type base layer 103 and the channel stop layer 105.

The semiconductive film 108 is an Si-film doped with, e.g., oxygen and has a resistivity of $10^7$ to $10^{13}$ Ω·cm.

The semiconductive film 108 is formed on the second p-type base layer 103 such that its one end overlaps the second p-type base layer 103 while its other end overlaps the channel stop layer 105.

An atmospheric pressure CVD film (oxide film) 109 having insulating properties is formed on the semiconductive film 108.

An emitter electrode 111 is formed on the surface of the Si substrate 101 via an insulating interlayer 110. This emitter electrode 111 is connected to the emitter layer 104 and the first and second p-type base layers 102 and 103.

A channel stopper electrode 112 connected to the channel stop layer 105 is formed on the surface of the Si substrate 101.

Thermal oxide films 113 are formed between the emitter electrode 111 and the semiconductive film 108 and between the channel stopper electrode 112 and the semiconductive film 108.

A collector electrode 115 is formed on the entire lower surface (the other major surface) of the Si substrate 101 via a p$^+$-type collector layer 114.

A method of manufacturing the IGBT having the above structure will be described next.

First, a thermal oxide film 113 having a thickness of approximately 400 nm is formed on the entire surface of an n-type Si substrate 101 by thermal oxidation and selectively etched. An oxide film 106 is formed on the surface of the Si substrate 101. A gate electrode 107 is formed on the gate oxide film 106.

First and second p-type base layers 102 and 103 are selectively formed on the surface of an n-type Si substrate 101, using B as an ion species and the gate electrode 107 as a mask. The ion implantation conditions include an acceleration voltage of 60 keV and a dose of $8 \times 10^{13}$ cm$^{-2}$. The diffusion conditions include a temperature of 1,150° C., a process time of 60 minutes, and a nitrogen atmosphere.

Next, an emitter layer 104 and a channel stop layer 105 are selectively formed in the first p-type base layer 102 and on the surface of the Si substrate 101, respectively, using As as an ion species and the gate electrode 107 as a mask. The ion implantation conditions include an acceleration voltage of 40 keV and a dose of $5 \times 10^{15}$ cm$^{-2}$. The diffusion conditions include a temperature of 1,000° C., a process time of 20 minutes, and an oxygen atmosphere.

An insulating interlayer 110 is formed on the gate electrode 107. The thermal oxide film 113 is selectively etched to partially expose the surface of the Si substrate 101, including that part of the second p-type base layer 103 and channel stop layer 105, which is between the second p-type base layer 103 and the channel stop layer 105.

A semiconductive film is formed on the entire surface by LP-CVD under film formation conditions in which the flow rate of Ar-based SiH$_4$ (20%) and N$_2$O for doping oxygen is 40:3, and the temperature is 700° C.

The semiconductive film is selectively etched to leave the semiconductive film only on the surface of the Si substrate 101 exposed between the thermal oxide films 113 and including part of the second p-type base layer 103 and channel stop layer 105, thereby forming a semiconductive film 108.

Subsequently, an atmospheric pressure CVD film 109 is formed on the entire surface by atmospheric pressure CVD. Thereafter, the atmospheric pressure CVD film 109 and the thermal oxide film formed together with the emitter are selectively etched to form contact holes for a prospective emitter electrode 111 and a prospective channel stopper electrode 112.

After an electrode material such as aluminum is uniformly deposited on the entire surface, the aluminum layer is selectively etched to form a channel stopper electrode 112 connected to the channel stop layer 105, and an emitter electrode 111 connected to the first and second p-type base layers 102 and 103 and the emitter layer 104.

After a p$^+$-type collector layer 114 is formed on the lower surface of the n-type Si substrate 101, an electrode material such as aluminum is uniformly deposited on the entire surface to form a collector electrode 115, thereby realizing the IGBT having the structure shown in FIGS. 2A and 2B.

According to the IGBT 100 having this structure, the dangling bond density of the semiconductive film 108 is increased, so the discrete levels in the band gap approach a continuum.

The time required until the trapping level in the semiconductive film 108 is populated with carriers can be shortened.

For this reason, even when the device is suddenly reverse-biased (dV/dt:large), spread of the depletion layer can be instantaneously stabilized.

Figure 3A:
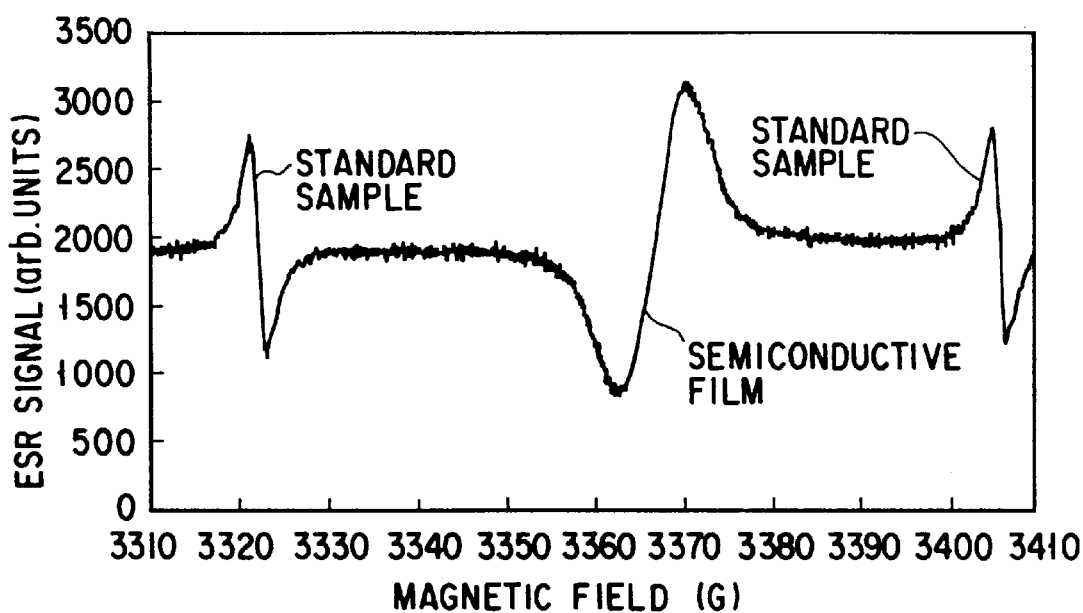
FIGS. 3A and 3B are graphs showing the evaluation result of a semiconductive film according to the first embodiment of the present invention in comparison with that of the prior art.
Figure 3B:
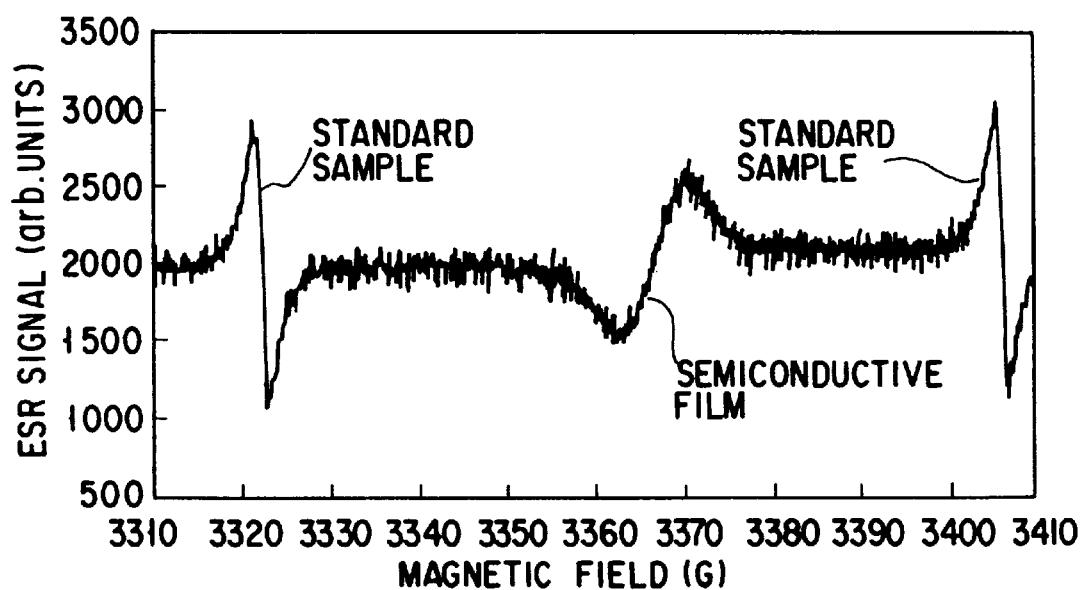

FIGS. 3A and 3B are graphs showing the results obtained upon evaluating semiconductive films using an ESR (Electron Spin Resonance apparatus). The evaluation result (FIG. 3A) of the semiconductive film 108 of the present invention, which has a dangling bond density of $1.25 \times 10^{18}$ cm$^{-3}$, is shown in comparison with that (FIG. 3B) of a conventional semiconductive film having a dangling bond density of $5 \times 10^{17}$ cm$^{-3}$.

As is apparent from FIGS. 3A and 3B, the semiconductive film 108 of the present invention has a dangling bond density roughly 2.5 times higher than that of the conventional semiconductive film and is closer to the amorphous state. This result suggests that the discrete levels in the band gap of the semiconductive film 108 of the present invention approach a continuum compared to that of the conventional semiconductive film.

Figure 4A:
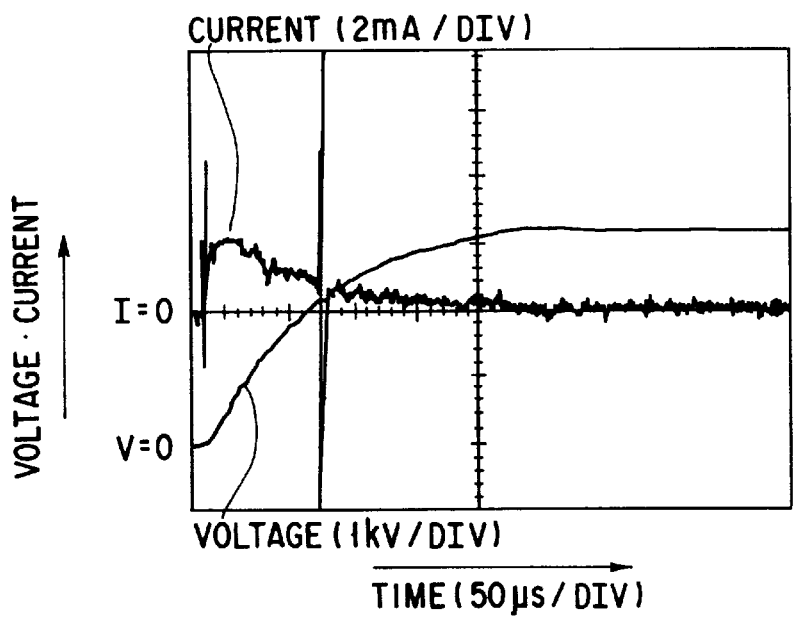
Figure 4B:
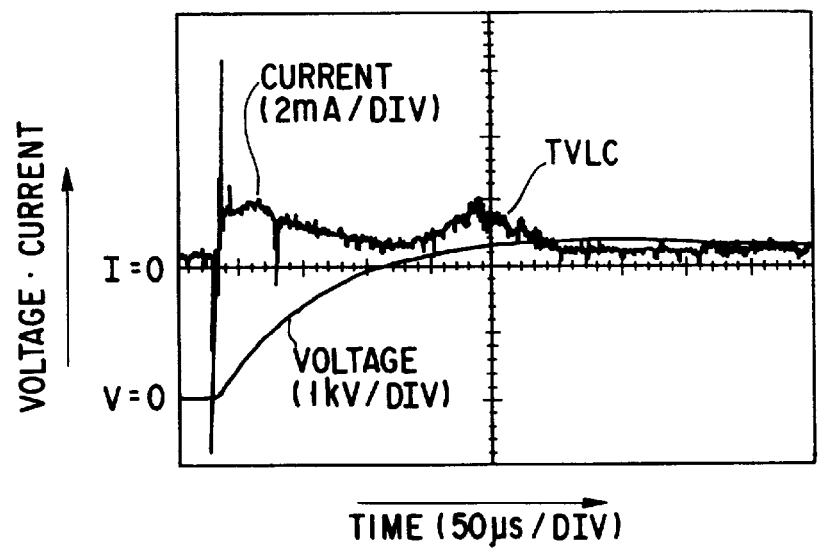

FIGS. 4A and 4B are graphs showing results obtained by observing a TVLC (Transient Voltage Leaking Current) in IGBTs using semiconductive films having different dangling bond densities.

As is apparent from FIG. 4A, in the IGBT 100 using a semiconductive film 108 having a dangling bond density of $1.25 \times 10^{18}$ cm$^{-3}$ the TVLC is rarely observed.

To the contrary, in an IGBT using a conventional semiconductive film having a dangling bond density of $5 \times 10^{17}$ cm$^{-3}$, a TVLC started to flow about 170 µs after the voltage application and was observed until about 250 µs had elapsed, as shown in FIG. 4B.

From the foregoing, possibly, no TVLC is observed in the device using the semiconductive film 108 having a dangling bond density of $1.25 \times 10^{18}$ cm$^{-3}$, since the discrete levels in the band gap approach a continuum, the speed at which the trapping level in the semiconductive film 108 is populated with carriers increases, and the interface between the semiconductive film 108 and the Si substrate 101 instantaneously stabilizes to smoothly spread the depletion layer.

A BT (Bias & Temperature) test for reliability evaluation was run for the IGBT 100 using the semiconductive film 108 having a dangling bond density of $1.25 \times 10^{18}$ cm$^{-3}$ while a reverse-bias voltage was applied at 125° C. for 1,000 hours. As a consequence, the semiconductive film 108 did not degrade, and a sufficient breakdown voltage as in a device using the conventional semiconductive film was obtained.

As described above, the discrete levels in the band gap of the semiconductive film approach a continuum.

More specifically, the dangling bond density of the semiconductive film is increased until the TVLC cannot be observed. With this structure, the speed at which the trapping level in the semiconductive film is populated with carriers increases, so the time required until the trapping level in the semiconductive film is populated with carriers can be shortened. Therefore, the interface between the semiconductive film and the Si substrate instantaneously stabilizes to smoothly spread the depletion layer, so the TVLC can be prevented from flowing.

In addition, even when the dangling bond density is increased, the semiconductive film does not degrade. Thus, the breakdown voltage of the device does not lower.

In the above-described first embodiment of the present invention, the IGBT has been exemplified. However, the present invention is not limited to this and can also be applied to, e.g., a p-n junction diode.

FIG. 5 schematically shows the structure of a p-n junction diode according to the second embodiment of the present invention.

In a p-n junction diode 200, a p-type diffusion layer (anode) 202 is selectively formed on the surface of an n-type semiconductor (Si) substrate 201, and an n$^+$-type diffusion layer (channel stopper) 203 is formed to surround the anode 202 at an interval.

A semiconductive film 204 is formed on the surface of the Si substrate 201 between and across the anode 202 and the channel stopper 203.

An atmospheric pressure CVD film (oxide film) 206 having insulating properties is formed on the semiconductive film 204 and on a thermal oxide film 205 formed on both sides of the semiconductive film 204.

An anode electrode 207 and a channel stopper electrode 208 are formed on the surface of the Si substrate 201 in correspondence with the anode 202 and the channel stopper 203, respectively.

A cathode electrode 209 is forged on the lower surface of the Si substrate 201.

Even in the p-n junction diode 200 having the above structure, when the dangling bond density of the semiconductive film 204 is set at about $1.25 \times 10^{18}$ cm$^{-3}$, the discrete levels in the band gap can approach a continuum. For this reason, the time for populating the trapping level in the semiconductive film 204 with carriers can be shortened.

As a result, almost the same effect as that of the IGBT according to the first embodiment can be expected.

The present invention can be applied not only to the p-n junction diode 200 having the above structure but also to a p-n junction diode 200' in which a lightly doped layer (RESURF) 211 of the same conductivity type as that of the anode 202 is formed around the anode 202, as shown in FIG. 6.

The dangling bond density of the semiconductive film is not limited to $1.25 \times 10^{18}$ cm$^{-3}$, and may be $10^{18}$ cm$^{-3}$ or more.

Instead of oxygen, nitrogen or carbon may be doped in the semiconductive film.

The semiconductive film is formed using Ar-based SiH$_4$. Additionally, Kr (krypton) can be used as a base.

To control the dangling bond density of the semiconductive film, ions may be implanted into the Si film after CVD.

Various changes and modifications can be made within the spirit and scope of the present invention, as a matter of course.

As has been described above in detail, according to the present invention, a semiconductor device having a high breakdown voltage and capable of preventing a leakage current from flowing when the device is reverse-biased, and a method of manufacturing the same can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A semiconductor device comprising:

a semiconductor substrate of a first conductivity type;

a first diffusion layer of a second conductivity type, which is selectively formed on one major surface of said semiconductor substrate;

a second diffusion layer of the first conductivity type, which is formed on the one major surface of said semiconductor substrate at a predetermined interval from said first diffusion layer; and a semiconductive film formed on the one major surface of said semiconductor substrate between said second and said first diffusion layers and having a dangling bond density of not less than $10^{18}$ cm$^{-3}$ and a resistivity of $10^7$ to $10^{13}$ Ω·cm.

2. A device according to claim 1, wherein said second diffusion layer is formed to surround said first diffusion layer.

3. A device according to claim 1, wherein said semiconductive film is formed with one end thereof overlapping said first diffusion layer and the other end thereof overlapping said second diffusion layer.

4. A device according to claim 1, wherein said semiconductive film essentially consists of silicon doped with at least one member selected from the group consisting of oxygen, nitrogen, and carbon.

5. A device according to claim 1, further comprising a CVD film having insulating properties and formed on said semiconductive film.

6. A device according to claim 1, wherein a p-n junction diode using said first diffusion layer as an anode is formed.

7. A device according to claim 1, wherein an IGBT using said first diffusion layer as a base is formed.

* * * * *